(12) United States Patent
Chen et al.

(10) Patent No.: US 7,394,296 B1
(45) Date of Patent: Jul. 1, 2008

(54) APPARATUS AND METHOD FOR AUTOMATICALLY OFFSETTING LINEAR DEVIATION OF V/F CONVERTER

(75) Inventors: Jacky Chen, Taoyuan Shien (TW); Yu-Sheng Chen, Taoyuan Shien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 6 days.

(21) Appl. No.: 11/621,106

(22) Filed: Jan. 8, 2007

(51) Int. Cl.
*H03C 3/00* (2006.01)
(52) U.S. Cl. ...................................... 327/101; 327/102
(58) Field of Classification Search ................. 327/101
See application file for complete search history.

(56) References Cited

U.S. PATENT DOCUMENTS 4,232,192 A * 11/1980 Beex ........................... 381/83
4,592,785 A * 6/1986 Reinert et al. ................. 134/18

* cited by examiner

*Primary Examiner*—Kenneth B. Wells
*Assistant Examiner*—John W Poos

(57) ABSTRACT

An apparatus and method for automatically offsetting the linear deviation of a V/F converter, the offset adjust pin of which is connected to a fixed resistance, and the frequency output pin of which is connected to a microcontroller unit (MCU) via an opto-isolator, a standard V/F transfer function being pre-stored in the MCU, wherein standard frequencies F1 and F0 (i.e., two coordination points (V1, F1) and (V0, F0)) are output by the V/F converter, when V1 and V0 are input as standard voltages, and the MCU may detect an error status in the V/F converter, when the V/F converter obtains real output frequencies F1' and F0' from real input voltages V1 and V2, and standard coordination points (F1, K1) and (F0, K0) will be corrected to (F1', K1) and (F0', K0'), from which a transfer function of offsetting frequency down is obtained, when the MCU processes a frequency down procedure.

1 Claim, 3 Drawing Sheets

APPARATUS AND METHOD FOR AUTOMATICALLY OFFSETTING LINEAR DEVIATION OF V/F CONVERTER

BACKGROUND OF THE INVENTION

1. Field of the Invention

The present invention generally relates to a V/F converter, in particular, to a V/F converter for power inverter.

2. Description of Prior Art

Following the increasing maturity of frequency conversion technology, the application of frequency converter is very popular currently, not only frequently seen in various domestic appliances (e.g., air conditioner, refrigerator, and washing machine), but also applied prevalently in each industrial control.

In frequency conversion application, a V/F converter is usually used, such as: TC9400 series manufactured by MICROCHIP Company and ADVFC32 manufactured by ANALOG DEVICE Company, which are all IC products that convert analogical voltage signal into digital frequency signal, such that the digitization of precision control may be processed conveniently. In said V/F converters, the relationship between input voltage and output frequency is a linear transfer function, which implies a direct proportion relationship between these two values. In all these V/F converters of IC products, an offset adjust pin (e.g., the second leg of TC9400 series and the first leg of ADVFC32) is usually arranged and connected to a variable resistance, the adjustment of which may change the slope of said transfer function during frequency conversion procedure, and thus a more accurate corresponding between the frequency output value and the voltage output value may be obtained.

However, such offsetting adjustment must be handled one by one through artificial manner, which is very uneconomical in a mass production of frequency converter, because it consumes substantial manpower and time. Furthermore, in the mobile structure of a variable resistance, its accuracy and endurance are all inferior to those of a fixed resistance, so the phenomenon of resistance floating is occurred frequently and also influences the accuracy of V/F conversion.

On the other hand, it has been very popular that a microcontroller unit is used in a frequency converter for processing digital control, but the prior frequency converter did not use the microcontroller unit for offsetting the transfer deviation of V/F converter. Therefore, if an existent microcontroller unit is used for automatically offsetting linear deviation of a V/F conversion, not only the cost of manpower and time needed by previously artificial adjustment can be completely saved without additional element cost, but also the unstable problem generated from the usage of variable resistance may be prevented.

SUMMARY OF THE INVENTION

Regarding aforementioned drawbacks, the present invention is to provide an apparatus and method for automatically offsetting linear deviation of V/F converter, the error of which may be automatically offset by a microcontroller unit (MCU) without artificial operation, thus manufacturing cost being reduced effectively.

The present invention is to provide an apparatus and method for automatically offsetting linear deviation of V/F converter, which uses fixed resistance instead of variable resistance, which is more expansive and less stable, thus the lifetime and stability of frequency controller being able to be promoted notably.

To achieve the objectives, the invention provides a V/F converter, the offset adjust pin of which is connected to a fixed resistance, and the frequency output pin of which is connected to a microcontroller unit (MCU) via an opto-isolator, a standard V/F transfer function being pre-stored in the MCU, wherein standard frequencies F1 and F0 (i.e., two coordination points (V1, F1) and (V0, F0)) are output by the V/F converter, when V1 and V0 are input as standard voltages, but the MCU may detect an error status in the V/F converter, when the V/F converter obtains real output frequencies F1' and F0' from real input voltages V1 and V2, and standard coordination points (F1, K1) and (F0, K0) will be corrected to (F1', K1) and (F0', K0'), from which a transfer function of offsetting frequency down may be obtained, when the MCU processes a frequency down procedure.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

In cooperation with attached drawings, the technical contents and detailed description of the present invention will be as follows.

Figure 1:
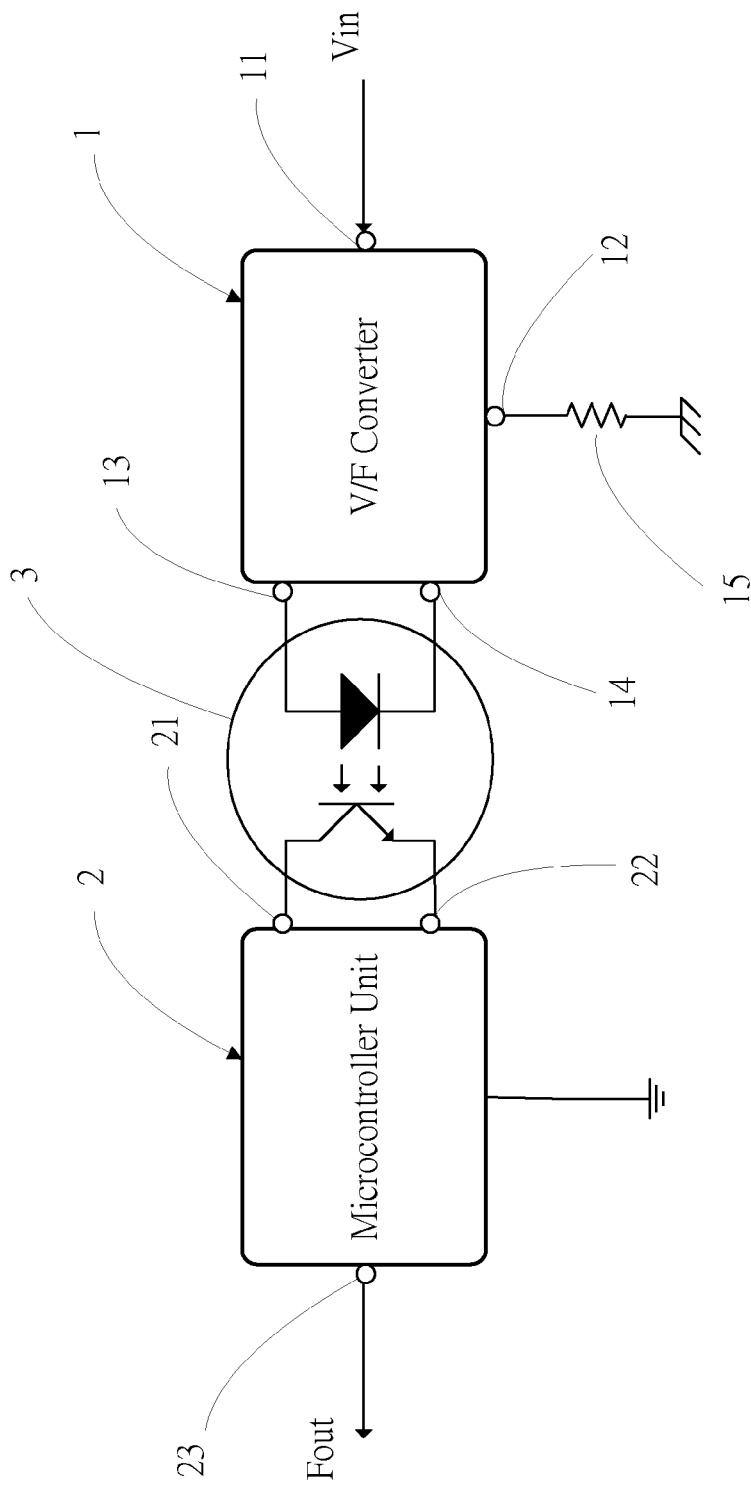
FIG. 1 is an apparatus block diagram according to the present invention.

Firstly, please refer FIG. 1, which is an apparatus block diagram of the invention, which is mainly comprised of a voltage/frequency (V/F) converter 1 and a microcontroller unit 2 (MCU). The frequency signal output sides 13, 14 of the V/F converter 1 are electrically connected to the input sides 21, 22 of the MCU 2 preferably in series via an opto-isolator 3, which may filter DC component in the frequency signal output from the V/F converter 1.

The voltage input side 11 of V/F converter 1 is electrically connected to a voltage signal source Vin to be transferred, while its offsetting adjust pin 12 is connected to a fixed resistance 15 for the provision of a fixed offsetting value to the V/F converter 1.

In this case, the MCU 2 processes offsetting procedure and frequency down management to the frequency signal input from the V/F converter 1. Since the output frequency of all IC products in general V/F converters 1 is in the level of kHz, for example the full scale frequencies 10 kHz, 100 kHz, and 500 kHz of said ADVFC 32, and the full scale frequency 100 kHz of said TC9400, which substantially exceed the frequency band 060 Hz needed by the control of an inverter, so it is necessary for the MCU 2 to process frequency down procedure to the high frequency signals input from the V/F converter 1, and thus the frequency down signals output from the output side 23 of MCU 2 may fulfill the controlling requirement of subsequent inverter.

Therefore, the relationship between the output and input of both V/F converter 1 and MCU 2 may be expressed respectively as a V/F transfer function and a frequency down transfer function, both of which are linear functions; that is, the V/F transfer function may be expressed as F(V)=aV+b, and the frequency down transfer function may be expressed as $K(F)=cF+d$, wherein a, b, c, and d are constants.

Figure 2:
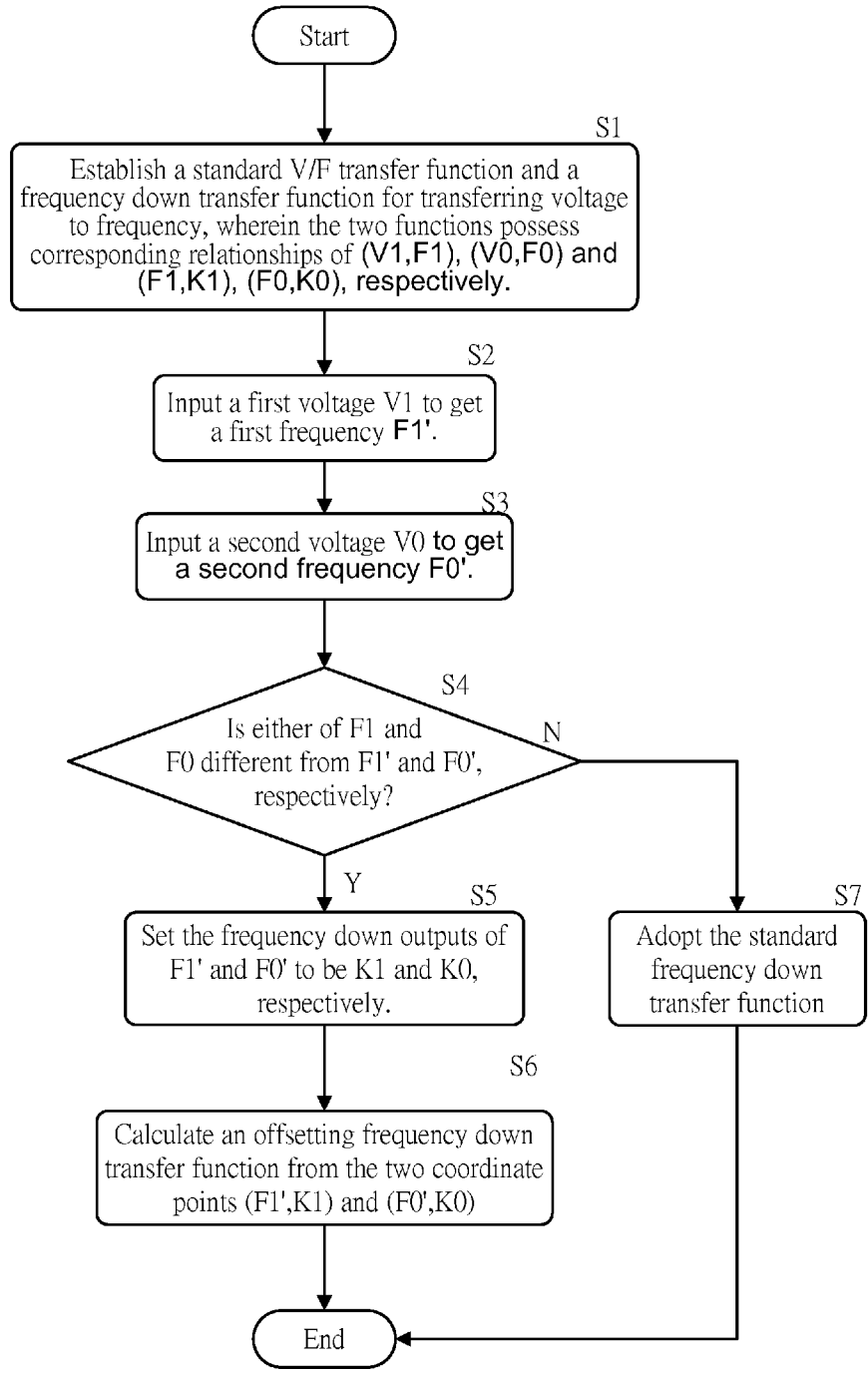
FIG. 2 is a flow chart of the deviation offsetting method according to the present invention.

FIG. 2 illustrates a flow chart of the deviation offsetting method of the invention, which includes following steps.

Step 1 (S1): firstly, a standard V/F transfer function and a standard frequency down transfer function are established in the MCU 2, two transfer functions possessing two corresponding relationships of (V1, F1), (V0, F0) and (F1, K1), (F0, K0), respectively; that is, when the input voltage is V1, the corresponding frequency from the V/F converter is F1, which is frequency down to K1; while the input voltage is V0, the frequency from V/F converter should be F0, which is further frequency down to K0.

Step 2 (S2): the first voltage V1 is really input into the V/F converter 1, which then outputs a real first frequency F1' to the MCU 2.

Step 3 (S3): the second voltage V0 is really input into the V/F converter 1, which again outputs a real second frequency F0' to the MCU 2.

Step 4 (S4): after receiving the two real frequencies F1' and F0', the MCU 2 compares both frequencies with standard frequencies F1 and F0; that is, judge if (F1, F0) is exactly same as (F1', F0')?

Step 5 (S5): if any frequency set is different (i.e., F1≠F1' or F0≠F0'), then the frequencies F1 are F0 are down to K1 and K0.

Step 6 (S6): in other words, after two coordinate points (F1',K1) and (F0', K0) are generated at a Cartesian coordinate, an offsetting frequency down transfer function is then calculated from these two coordinate points. At the Cartesian coordinate, the figure of this offsetting frequency down transfer function, which is a linear function, is a straight line passing through said two coordinate points. Subsequently, with this offsetting frequency down transfer function, the MCU 2 offsets the linear deviation of the V/F converter 1 during frequency down conversion.

Step 7 (S7): in step 6 (S6), if F1=F1' and F0=F0', then original standard frequency down transfer function is still valid, any further offset being unnecessary, because there is no transferring deviation existed in V/F converter.

Figures 3A, 3B:
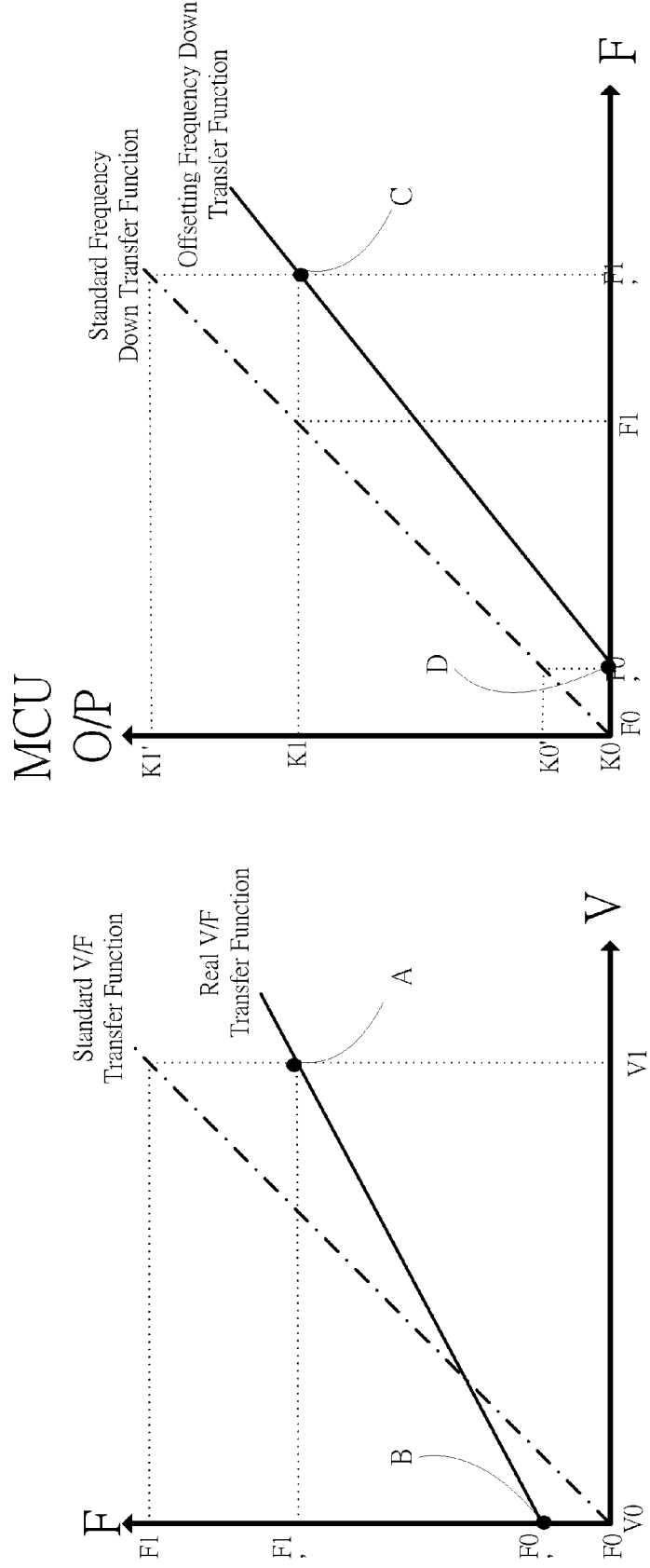
FIG. 3-A, B are coordinate diagrams of the transfer functions according to the present invention.

Please refer to FIG. 3-A, B, which are illustrating figures for the transfer functions of the invention shown in Cartesian coordinate. FIG. 3-A is an illustrating figure of the V/F transfer function, wherein the abscissa represents the input voltage (V), while the ordinate represents the output frequency of V/F converter 1. In FIG. 3-A, two straight lines respectively represent standard V/F transfer function and real V/F transfer function, the straight line of real V/F transfer function being formed by linking up two coordinate points A, B, which have coordinates (V1, F1') and (V0, F0'). FIG. 3-B is an illustration figure of the standard frequency down transfer function and the offset frequency down transfer function, both of which are shown in a Cartesian coordinate, wherein the abscissa represents the output frequency of the V/F converter 1, while the ordinate represents the frequency down output of the MCU 2. In FIG. 3-B, the straight line of the offset frequency down transfer function is formed by linking up two coordinate points C, D, which have coordinates (F1', K1) and (F0', K0').

Aforementioned description is only preferable embodiment according to the present invention, being not used to limit its executing scope. Any equivalent variation and modification made according to appended claims is all covered by the claims claimed by the present invention.

What is claimed is:

1. A method for automatically offsetting linear deviation of V/F converter, comprising following steps:
   a) setting up a standard V/F transfer function and a standard frequency down function, both standard functions having a corresponding relationship between (V1, F1), (V0, F0) and (F1, K1), (F0, K0);
   b) inputting a first voltage V1, thus a real first frequency F1' being obtained;
   c) inputting a second voltage V0, thus a real second frequency F0' being obtained;
   d) comparing above two corresponding value sets, namely, F1' with F1, and F0' with F0;
   e) in step d, if any corresponding values are different, namely, F1≠F1' or F0≠F0', frequency down values K1 and K0 are set correspondingly to F1' and F0' respectively;
   f) according to two coordinate points (F1', K1) and (F0', K0), calculating an offset frequency down function, figure of which is a straight line passing through said two coordinate points in a Cartesian coordinate.

* * * * *